United States Patent [19]

Barnett et al.

[11] Patent Number: 5,057,163

[45] Date of Patent: Oct. 15, 1991

[54] DEPOSITED-SILICON FILM SOLAR CELL

[75] Inventors: Allen M. Barnett; Robert B. Hall, both of Newark, Del.; James A. Rand, Oxford, Pa.; David H. Ford, Wilmington, Del.

[73] Assignee: AstroPower, Inc., Newark, Del.

[21] Appl. No.: 190,138

[22] Filed: May 4, 1988

[51] Int. Cl.$^5$ .............................................. H01L 31/06
[52] U.S. Cl. ................................... 136/258; 136/256; 136/259; 136/261; 357/30
[58] Field of Search ................. 136/256, 258 PC, 261, 136/259; 357/30 J, 30 K, 30 Q, 59 D

[56] References Cited

U.S. PATENT DOCUMENTS

| | | | |
|---|---|---|---|
| 4,390,743 | 6/1983 | Dahlberg | 136/258 |
| 4,522,661 | 6/1985 | Morrison et al. | 148/33.2 |
| 4,523,051 | 6/1985 | Mickelsen et al. | 136/260 |
| 4,571,448 | 2/1986 | Barnett | 136/256 |
| 4,639,543 | 1/1987 | Fang | 136/256 |
| 4,677,250 | 6/1987 | Barnett et al. | 136/258 |
| 4,818,337 | 4/1989 | Barnett et al. | 156/659.1 |

OTHER PUBLICATIONS

A. M. Barnett et al., *Int'l PVSEC*-3, pp. 101–104 (Nov. 1987).
M. G. Mark et al., *Conference Record, 18th IEEE Photovoltaic Specialists Conference* (1985); pp. 192–197.
A. M. Barnett et al., *Conference Record, 19th IEEE Photovoltaic Specialists Conference* (1987); pp. 1266–1270.
T. L. Chu et al., *Solid State Electronics*, vol. 19, pp. 837–841 (1976).

Primary Examiner—Aaron Weisstuch
Attorney, Agent, or Firm—Ratner & Prestia

[57] ABSTRACT

A thin-film photovoltaic solar cell features a thin polycrystalline silicon active semiconductor formed over a conductive ceramic substrate. Between the substrate and the adjacent active semiconductor layer is a barrier layer which provides for reflection of light, minimizes back surface recombination and prevents contamination of the active semiconductor.

26 Claims, 1 Drawing Sheet

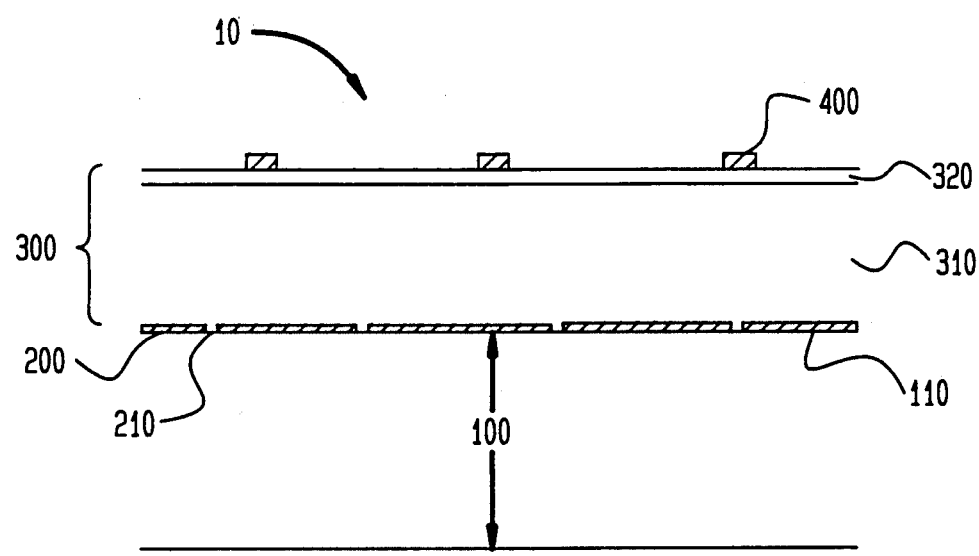

DEPOSITED-SILICON FILM SOLAR CELL

FIELD OF THE INVENTION

This invention relates to the field of art of thin-film photovoltaic solar cells for the conversion of sunlight into electricity.

BACKGROUND OF THE INVENTION

Photovoltaic solar cells are semiconductor devices which convert sunlight into electricity. Solar cells based on crystalline silicon offer the advantage of high performance and stability. The principal barrier to expanded utilization of silicon solar cells for electric power generation is the present high cost of the solar cells.

Significant cost reductions can be achieved by using thin-film solar cells. Thin-film solar cells use thin layers of semiconductor materials that are deposited or grown on low cost substrates. A publication by A. M. Barnett et al. in the *Conference Record of 19th IEEE Photovoltaic Specialists Conference* (1987) pp. 1266-1270, which is incorporated by reference herein, describes polycrystalline silicon thin-film solar cells on low cost substrates. In addition to the lower cost that results from using less photovoltaic grade silicon, i.e., less than a 100 micron thick layer instead of a 400 micron thick wafer, improved performance is also predicted as a consequence of the thinness of the silicon. The publication describes further enhancement in performance that results from employing optical confinement techniques. In a related publication, which appears in the *Technical Digest of the Third International Photovoltaic Science and Engineering Conference*, PVSEC-3 (1987) pp. 101-104 and is incorporated by reference herein, A. M. Barnett et al. disclose a set of design criteria for thin film silicon to yield high performance solar cells.

The prior art includes a number of descriptions of thin silicon solar cells. For example, U.S. Pat. No. 4,571,488 issued to A. M. Barnett discloses a thin film solar cell formed on various substrate materials and a conducting or semiconducting metallurgical barrier layer between the substrate on the active layers of the solar cell. M. G. Mauk et al. in the *Conference Record of the 18th IEEE Photovoltaics Specialists Conference* (1985) pp. 192-197, describe a solar cell with thin epitaxial silicon active layers on a heavily doped silicon wafer with a thin film of silicon dioxide between the active layers and the substrate. U.S. Pat. No. 4,677,250 to A. M. Barnett et al., discloses solar cells employing polycrystalline thin-film semiconductor active layers deposited on various substrates and an insulator with conductive nucleation sites between the substrate and the active semiconductor layer.

It is an object of this invention to provide a low cost, high efficiency thin silicon solar cell which is formed on a low cost substrate.

SUMMARY OF THE INVENTION

A photovoltaic solar cell having a polycrystalline thin-film active semiconductor layer is formed over a thermal expansion matched substrate. Between the substrate and the active semiconductor is a barrier layer which is selected to: provide for reflection of light; minimize back surface recombination; and prevent contamination of the active semiconductor layer by the substrate. The barrier layer includes a multiplicity of contact regions where the active semiconductor is in electrical communication with the conducting plane of the substrate. In a preferred embodiment, the substrate is a conductive ceramic material comprised of silicon and a meltable glass and/or silicon carbide, the barrier is an insulating material, the contact regions are openings in the barrier layer exposing less than 5% of substrate and the active semiconductor is a silicon p-n homojunction.

THE DRAWINGS

The FIGURE is cross-sectional view, enlarged and not to scale, of a thin-film solar cell in accordance with this invention.

DETAILED DESCRIPTION

Desired properties of a polycrystalline thin-film silicon active semiconductor in accordance with the teachings of this invention are: planar film with single crystal grains at least twice as wide as their thickness; thickness in the range 5 to 100 microns; benign grain boundaries; minority carrier diffusion length at least two times the thickness; and a substrate to provide mechanical support and back plane conductor. The criteria on grain aspect ratio, diffusion length and grain boundaries are applied to minimize recombination losses. Optical confinement is also necessary to recapture the loss in light generated current owing to the silicon thinness. Optical confinement accomplishes this by increasing the effective photon absorption length in thin silicon solar cells.

Shown in the FIGURE is a schematic cross-section of a solar cell 10 in accordance with the invention. This device conforms to the aforementioned design criteria and may be manufactured at low cost. The solar cell is formed on substrate 100 which functions as a mechanical support and includes a back plane conductor 110 over which the solar cell is formed. The substrate material is selected to have a thermal expansion coefficient that is matched to silicon to minimize stress during the fabrication of the solar cell, which may require processing at temperatures above 1410° C., the melting point of silicon. The thermal expansion coefficient of silicon increases monotonically from 4 to $5 \times 10^{-6}$ cm/cm $-$° C. in the temperature range 400° to 1000° C. A substrate material in accordance with the teachings of this invention with a thermal expansion coefficient of $4 \times 10^{-6}$ cm/cm $-$° C. is acceptable. The substrate may be electrically conductive or non-conductive, although a conductive substrate is preferred. If the substrate is not conductive, a back plane conductor material (not shown in the Figure), such as a layer of metal, is provided on the surface of the substrate upon which the cell is formed. Optionally a back plane conductor material may also be provided as a separate layer over a conductive substrate, as well. The substrate may also be textured to provide for diffuse reflection of light and optical confinement. In the case of a conductive substrate, external electrical contact means, such as silver, is applied to the bottom of the substrate 100.

The preferred substrate in accordance with the teachings of this invention is a ceramic material, that is, a nonmetallic inorganic material containing a high proportion of silicon. A ceramic comprised of low purity silicon in the range of 20 to 90% by weight and up to 80% by weight of silicon carbide and/or a glass, has been found to be suitable. For example, a conductive ceramic substrate is fabricated from a mixture of 40% by weight silicon powder with initial particle size less than 500 microns and 60% SiC with particle sizes less than 100 microns by means of powder metallurgy techniques, including sintering in an apparatus with an oxygen free chamber which employs a graphite heater designed to provide a suitable thermal profile to accomplish the sintered product. Thus, the powder mixture is formed into a low density member which is sintered or fused at sufficiently high temperature to form a dense conductive ceramic substrate having an average bulk resistivity of 0.001 to 10.00 ohm-cm, an average density of about 1.5 to 1.9 gram per cubic centimeter, a thickness of 0.03 to 0.08 cm and area that is 10 cm × 10 cm or larger.

Over the back plane conductor of the substrate is barrier layer 200 and active semiconductor 300 is formed over the barrier layer. Barrier layer 200 is selected to: provide strength at the temperature required for fabrication of the cell; act as a barrier to prevent diffusion of impurities from the substrate into the active layer of the solar cell; to passivate the interface between the barrier layer and active semiconductor in order to minimize surface recombination of photo-generated carriers; have an index of refraction that is different from that of the active semiconductor in order to provide a reflective surface for optical confinement. Barrier 200 may be a single layer or multiple layers with each layer satisfying one or more of these requirements. The multi-layer barrier comprises a first barrier layer of titanium diboride, or titanium dioxide or aluminum oxide over the substrate to provide for strength and act as diffusion barrier. A second barrier layer of silicon dioxide, which acts to minimize surface recombination and to also provide for reflection, covers the first barrier to form a multi-layer barrier in accordance with the teachings of this invention. When a multi-layer barrier comprising titanium diboride is employed, the titanium diboride may also serve as back plane conductor 110 and as a reflector. For the multi-layer case, titanium diboride plus silicon dioxide is preferred. The thickness of barrier 200 is 0.1 to 1.0 micron. For the case of a single layer, silicon dioxide or silicon nitride may be used, and silicon dioxide is preferred. The single silicon dioxide barrier thickness is 0.4 micron.

Contact regions 210 provide for electrical communication between back contact plane 110 and active semiconductor 300. Contact regions 210 in accordance with the teachings of this invention are a multiplicity of openings in barrier layer 200. The size and spatial distribution of openings is selected such that contact regions 210 occupy 0.5 to 5% of the area of barrier 200. For example, an array of circular openings of 10 micron diameter spaced apart on 100 micron centers or a series of parallel grooves that are 10 microns wide and 500 microns apart would be suitable.

Barrier 200 and contact regions 210 can be formed by coating the back contact plane 110 of substrate 100 with the barrier in the desired pattern. Screen printing, spray coating or sputtering through a mask are useful methods of forming the barrier with contact regions according to this invention. Alternately, the barrier layer may be applied as a single continuous layer and the contact regions formed by selective removal of barrier material. Selective removal may be accomplished by a variety of techniques including photolithographic or serigraphic patterning followed by chemical etching, mechanical scribing or jet etching.

This invention further contemplates forming the contact regions 210 such that the height of barrier 200 above the back contact plane and the height of the contact regions are approximately the same in order to facilitate application of active semiconductor layer 300. This may be accomplished by selectively filling the openings in the barrier with a suitable material such as conductive ceramic or metal. The material should be capable of making ohmic contact to the semiconductor layer and may further serve as a dopant source for formation of a back surface field in the semiconductor.

When the substrate is of sufficient purity, barrier layer 200 may be omitted with some loss in efficiency due to the absence of optical enhancement that is provided by the barrier. An efficiency of 15% is expected when the barrier is omitted.

Active semiconductor layer 300 is comprised of two contiguous regions of opposite conductivity type and a photovoltaic junction. In accordance with this invention semiconductor layer 300 is a polycrystalline thin-film of silicon between 5 and 100 microns thick and preferably 30 microns thick. The grain diameter of the polycrystalline silicon should be at least twice the film thickness. Base region 310 of semiconductor layer 300 is p-type silicon that is 5 to 100 micron thick and is doped to have a p-type carrier concentration of $1 \times 10^{16}$ to $5 \times 10^{17}$ cm$^{-3}$ and is characterized by a minority carrier diffusion length of at least twice the thickness. A thin n-type silicon emitter region 320, typically 0.2 micron thick and doped to n-type carrier concentration of $10^{20}$ cm$^{-3}$, forms a p-n homojunction with base region 310. A solar cell featuring a polycrystalline silicon thin film semiconductor in accordance with this invention is expected to have conversion efficiency greater than 19%. Another feature of the thin solar cell of this invention is that the requirements for minority carrier transport properties are far less severe than for conventional thick silicon cells. For example when the active semiconductor is 30 microns thick, a diffusion length of only 60 microns is all that is required to achieve high performance. Accordingly, great flexibility in the method of forming the active semiconductor is available for adapting low cost manufacturing methods to producing solar cells in accordance with this invention. Among the methods that are suitable for forming the active semiconductor are well known coating techniques which may be used alone or in conjunction with a re-crystallization step following application of the semiconductor material. For example, coating methods such as chemical vapor deposition, growth from liquid saturated solution, sputtering, vacuum evaporation, ionized cluster beam deposition, spray coating, plasma arc spraying and powder metallurgy may be used to deposit the active semiconductor. Chemical vapor deposition in conjunction with re-crystallization is preferred for forming base region 310 of active semiconductor 300 and diffusion doping is preferred for forming emitter region 320.

The solar cell of this invention is completed by transparent contact means 400 such as a metal grid that is applied to the light receiving surface of semiconductor 300 using methods known in the art such as screen printing, evaporation and the like. Anti-reflection and surface passivation coatings, all known in the art, may also be applied in order to increase the performance of a solar cell in accordance with the teachings of this invention.

What is claimed is:

1. In a thin film photovoltaic solar cell comprising, in order, a substrate functioning as a mechanical support, a back plane conductor functioning as a first electrical contact, at least one semiconductor layer, including at least one photovoltaic junction, and second electrical contact means, the improvement being: a substrate comprised of a ceramic material that is selected to have a thermal expansion coefficient that is matched to the semiconductor and containing silicon in the amount of 20 to 90 percent by weight; a barrier layer including a multiplicity of contact regions interposed between the back plane conductor and the semiconductor layer; and the semiconductor layer is a polycrystalline thin-film.

2. The solar cell of claim 1 wherein the ceramic material contains silicon carbide or glass, or a mixture thereof.

3. The solar cell of claim 1 wherein the substrate is electrically conductive.

4. The solar cell of claim 3 wherein the back plane conductor is a surface of the substrate.

5. The solar cell of claim 1 wherein the back plane conductor is a layer of metal formed over the substrate.

6. The solar cell of claim 1 wherein the substrate is textured in order to provide for optical confinement.

7. The solar cell of claim 1 wherein the barrier layer has an index of refraction different from the index of the semiconductor to provide for reflection of light.

8. The solar cell of claim 1 wherein the barrier layer is selected to minimize back surface recombination in the solar cell.

9. The solar cell of claim 1 wherein the barrier layer is selected to prevent diffusion of impurities between the substrate and the semiconductor.

10. The solar cell of claim 1 wherein the barrier layer is a layer of silicon dioxide.

11. The solar cell of claim 1 wherein the barrier layer is a layer of silicon nitride.

12. The solar cell of claim 1 wherein the barrier layer includes at least two layers.

13. The solar cell of claim 12 wherein the barrier layer is comprised of a first barrier layer selected from titanium diboride, titanium dioxide, and aluminum oxide and a second barrier layer of silicon dioxide.

14. The solar cell of claim 13 wherein the first barrier layer is titanium diboride which functions as the back plane conductor.

15. The solar cell of claim 1 wherein the contact regions are a multiplicity of openings layer which extend through the barrier layer to the back contact plane and which occupy 0.5 to 5 per cent of the area of the barrier.

16. The solar cell of claim 15 wherein the openings are filled with a conductive material to a height level with the barrier layer.

17. The solar cell of claim 16 wherein the conductive material is a ceramic.

18. The solar cell of claim 16 wherein the conductive material is a metal.

19. The solar cell of claim 16 wherein the conductive material includes a dopant for forming a back surface field in the semiconductor layer.

20. The solar cell of claim 1 wherein the semiconductor is silicon.

21. The solar cell of claim 20 wherein the silicon is less than 100 microns thick.

22. The solar cell of claim 1 wherein the semiconductor is characterized by a grain diameter that is at least two times the thickness.

23. The solar cell of claim 1 wherein the semiconductor is characterized by a minority carrier diffusion length that is two times the thickness.

24. The solar cell of claim 1 wherein the semiconductor is comprised of two regions of opposite conductivity type and the photovoltaic junction is a homojunction.

25. A thin-film photovoltaic solar cell comprising, in order:
   a. a conductive ceramic substrate containing silicon in the amount of 20 to 90 percent by weight and functioning as a mechanical support and first electrical contact;
   b. a silicon dioxide barrier layer over the substrate to provide for reflection of light, to minimize back surface recombination and to prevent diffusion of impurities;
   c. a multiplicity of openings in the barrier layer occupying less than 5% of the area of the substrate to provide for electrical contact to the substrate;
   d. a layer of polycrystalline silicon less than 100 microns thick over the barrier, which includes a p-type region and an n-type region thereon forming a photovoltaic homojunction therebetween;
   e. a transparent second electrical contact means applied to the layer of polycrystalline silicon.

26. A thin-film photovoltaic solar cell comprising, in order:
   a. a conductive ceramic substrate containing silicon in the amount of 20 to 90 percent by weight and functioning as a mechanical support and first electrical contact;
   b. a layer of polycrystalline silicon less than 100 microns thick over the substrate, which includes a p-type region and an n-type region thereon forming a photovoltaic homojunction therebetween; and
   c. a transparent second electrical contact means applied to the layer of polycrystalline silicon.

* * * * *